US008329839B2

(12) United States Patent
Smith et al.

(10) Patent No.: US 8,329,839 B2
(45) Date of Patent: Dec. 11, 2012

(54) MELT-PROCESSIBLE POLY(TETRAFLUOROETHYLENE)

(75) Inventors: Paul Smith, Zurich (CH); Jeroen F. Visjager, Zurich (CH); Cees Bastiaasen, Maastricht (NL); Theodorus Tervoort, Zurich (CH)

(73) Assignee: Eidgenossische Technische Hochschule, Zurich (CH)

( * ) Notice: Subject to any disclaimer, the term of this patent is extended or adjusted under 35 U.S.C. 154(b) by 0 days.

(21) Appl. No.: 12/926,746

(22) Filed: Dec. 7, 2010

(65) Prior Publication Data

US 2011/0218311 A1    Sep. 8, 2011

Related U.S. Application Data

(60) Division of application No. 11/812,718, filed on Jun. 21, 2007, now Pat. No. 7,872,081, which is a division of application No. 10/736,771, filed on Dec. 17, 2003, now Pat. No. 7,276,287, which is a continuation of application No. 09/505,279, filed on Feb. 16, 2000, now Pat. No. 6,737,165, which is a continuation-in-part of application No. 09/369,319, filed on Aug. 6, 1999, now Pat. No. 6,531,559.

(60) Provisional application No. 60/095,583, filed on Aug. 6, 1998.

(51) Int. Cl.
*C08F 114/18* (2006.01)

(52) U.S. Cl. ........................................ 526/247; 526/242

(58) Field of Classification Search .................. 526/247, 526/242
See application file for complete search history.

(56) References Cited

U.S. PATENT DOCUMENTS

| | | | | |
|---|---|---|---|---|
| 3,770,711 | A * | 11/1973 | Hartig et al. | 428/35.1 |
| 3,962,153 | A * | 6/1976 | Gore | 521/79 |
| 5,089,200 | A * | 2/1992 | Chapman et al. | 264/127 |
| 5,266,639 | A * | 11/1993 | Chapman et al. | 525/200 |
| 5,814,405 | A * | 9/1998 | Branca et al. | 428/311.51 |
| 6,737,165 | B1 * | 5/2004 | Smith et al. | 428/422 |

FOREIGN PATENT DOCUMENTS

| | | |
|---|---|---|
| JP | 51-54678 | 5/1976 |
| JP | 60-101134 | 6/1985 |
| JP | 61-69853 | 4/1986 |
| JP | 61-136543 | 6/1986 |
| JP | 61-241346 | 10/1986 |
| JP | 05-78497 | 5/1993 |
| JP | 07-237257 | 9/1995 |
| JP | 11-286501 | 10/1999 |
| JP | 2002-503744 | 2/2002 |
| JP | 2003-520863 | 7/2003 |

OTHER PUBLICATIONS

English Translation of Office Action for Japanese counterpart Application No. 2001-560289 dated Apr. 22, 2011.

* cited by examiner

*Primary Examiner* — Peter D. Mulcahy
*Assistant Examiner* — Henry Hu
(74) *Attorney, Agent, or Firm* — Jones Day

(57) ABSTRACT

Melt-processible, thermoplastic poly(tetrafluoroethylene) (PTFE) compositions are disclosed and methods for making and processing same. Additionally, products comprising these compositions are described.

6 Claims, 3 Drawing Sheets ns, fibers and coatings of PTFE are produced by, for example, ram-extrusion, pre-forming and sintering of compressed powder, optionally followed by machining or skiving, paste-extrusion, high isostatic pressure processing, suspension spinning, and the like, and direct plasma polymerization.

MELT-PROCESSIBLE POLY(TETRAFLUOROETHYLENE)

CROSS REFERENCE TO RELATED APPLICATIONS

This application is a divisional of U.S. application Ser. No. 11/812,718 (now U.S. Pat. No. 7,872,081) filed Jun. 21, 2007, which is a divisional of U.S. application Ser. No. 10/736,771, filed Dec. 17, 2003, which is further a continuation of U.S. application Ser. No. 09/505,279, filed Feb. 16, 2000 (now U.S. Pat No. 6,737,165), which is further a continuation-in-part of U.S. application Ser. No. 09/369,319 filed Aug. 6, 1999 (now U.S. Pat. No. 6,531,559), which further claims the benefit of U.S. provisional application 60/095,583 filed Aug. 6, 1998. These applications, in their entirety, are incorporated herein by reference.

FIELD OF THE INVENTION

This invention relates to melt-processible poly(tetrafluoroethylene) (PTFE), compositions thereof, articles formed therefrom, and methods for making the same. More particularly, the present inventions relates to a particular range of poly(tetrafluoroethylene) polymers which are readily melt-processible while maintaining good mechanical properties. Further, the present invention relates to products made of melt-processible, thermoplastic PTFE compositions.

BACKGROUND OF THE INVENTION

Poly(tetrafluoroethylene) (PTFE) is well-known for, among other properties, its chemical resistance, high temperature stability, resistance against ultra-violet radiation, low friction coefficient and low dielectric constant. As a result, it has found numerous applications in harsh physico-chemical environments and other demanding conditions. Equally well-known is the intractability of this important polymer. Numerous textbooks, research articles, product brochures and patents state that PTFE is intractable because, above its crystalline melting temperature, it does not form a fluid phase that is of a viscosity that permits standard melt-processing techniques commonly used for most thermoplastic polymers (Modern Fluoropolymers, J. Scheirs, Ed. Wiley (New York), 1997; The Encyclopaedia of Advanced Materials, Vol. 2, D. Bloor et al. Eds., Pergamon (Oxford) 1994; WO 94/02547; WO 97/43102). Suitability of a polymer for standard melt-processing techniques may be evaluated, for example, through measurement of the melt-flow index (MFI) of the material (cf. ASTM D1238-88). Melt-processible polymers should, according to this widely employed method, exhibit at least a non-zero value of the melt-flow index, which is not the case for common PTFE under testing conditions that are representative of, and comparable to those encountered in standard polymer melt-processing. The extremely high viscosity of PTFE, reported to be in the range of $10^{10}$-$10^{13}$ Pa·s at 380° C., is believed to be associated, among other things, with an ultra-high molecular weight of the polymer, which has been estimated to be in the regime well above 1,000,000 g/mol and often is quoted to be of the order of 10,000,000 g/mol. In fact, it is claimed (Modern Fluoropolymers, J. Scheirs, Ed. Wiley (New York), 1997, p. 240) that "to achieve mechanical strength and toughness, the molecular weight of PTFE is required to be in the range $10^7$-$10^8$ g/mol . . . ". Due to this high viscosity, common PTFE is processed into useful shapes and objects with techniques that are dissimilar to standard melt-processing methods. Rods, sheets, mem- Illustrative for the difficulties encountered in processing common PTFE are the complex and indirect methods by which fibers are produced from this polymer.

Polytetrafluoroethylene fibers have been produced, as described in U.S. Pat. No. 3,655,853, by forming a mixture of viscose and PTFE particles in a dispersion, extruding the mixture through a spinneret into an acidic bath to form fibers consisting of a cellulosic matrix containing the PTFE particles. After washing and rinsing, the fibers are heated to a temperature of about 70° C. to 390° C. to decompose the cellulosic material and to melt and coalesce the polymer particles. The fibers are then drawn at a ratio of about 4:1 to 35:1 typically at a temperature between 370° C. and 390° C. The fibers produced by this relatively complex and expensive process may require further processing steps, such as bleaching to remove residual contaminants, which commonly lowers the tensile strength. Another method to produce fibers of PTFE is described in U.S. Pat. Nos. 3,953,566, 3,962,153, and 4,064,214. In this method a paste formed by mixing a lubricant, such as a mineral spirit, with a fine powder of PTFE produced by coagulation of an aqueous dispersion of PTFE particles, is extruded and formed to produce a tape, film or bead. The product thus formed, is slit to form fibers, is dried to remove the lubricant and subsequently stretched at a high rate, and at a temperature lower than the crystalline melt point of PTFE, to produce a porous article. The porous article is then heated while maintained in the stretched condition to a temperature above the melt point of crystalline PTFE, generally considered to be in the range 327° C. to 345° C., to increase strength. Alternatively, PTFE fibers are produced by first forming a solid preform by sintering the polymer for prolongued periods of time above the melting temperature of the polymer and cooling the mass down to room temperature, which is a process that may take as much as 48 hrs. Subsequently, PTFE fibers are cut from the preform by the well-know skiving method, typically yielding fibers of high denier (>>100).

Unfortunately, the above methods generally are less economical than common melt-processing, and, in addition, severely limit the types and characteristics of objects and products that can be manufactured with this unique polymer. For example, common thermoplastic polymers, such as polyethylene, isotactic polypropylene, nylons, poly(methylmethacrylate) polyesters, and the like, can readily be melt-processed into a variety forms and products that are of complex shapes, and/or exhibit, for example, some of the following characteristics: dense, void-free, thin, clear or translucent; i.e. properties that are not readily, if at all, associated with products fabricated from PTFE.

The above drawback of PTFE has been recognised virtually since its invention, and ever since, methods have been developed to circumvent the intractability of the polymer. For example, a variety of co-monomers have been introduced in the PTFE macromolecular chains that lead to co-polymers of reduced viscosity and melting temperature. Co-polymers are those that are polymerized with, for example, hexafluoropropylene, perfluoro(methyl vinyl ether), perfluoro(ethyl vinyl ether), perfluoro(propyl vinyl ether), or perfluoro-(2,2-dimethyl-1,3-dioxole), partially-fluorinated monomers and combinations thereof, in addition to the tetrafluoroethylene monomer. Several of the resulting co-polymers (for example, those referred to as FEP, MFA, PFA and Teflon® AF) provide improved processability, and can be processed with techniques for common thermoplastic polymers (WO 98/58105). However, a penalty is paid in terms of some or all of the outstanding properties of the homopolymer PTFE, such as reduced melting temperature and thermal and chemical stability.

Additional methods to process the PTFE homopolymer include, for example, the addition of lubricants, plasticizers, and processing aids, as well as oligomeric polyfluorinated substances and hydrocarbyl terminated TFE-oligomers (for example, Vydax® 1000) (U.S. Pat. Nos. 4,360,488; 4,385,026 and WO 94/02547). The latter method, however, is directed to the improvement of the creep resistance of common PTFE which results in a bimodal morphology with two distinct melting temperatures, and generally does not lead to homogeneous PTFE compositions that can be melt-processed according to standard methods. For example, only a hot-compression molding method is heretofore known for mixtures of standard PTFE and Vydax® 1000, that preferably is carried out in the narrow temperature range between about 330° C. to 338° C. The other aforementioned additions of lubricants, plasticizers, and processing aids also do not yield truly melt-processible PTFE compositions. Solution processing, at superautogeneous pressure, of PTFE from perfluoroalkanes containing 2-20 carbon atoms has been disclosed in WO 94/15998. The latter process is distinctly different from melt-processing methods. Also disclosed is dispersion, and subsequent melt-processing of standard PTFE into thermoplastic (host-) polymers such as polyetheretherketone and polyphenylene sulfide (WO 97/43102) and polyacetal (DE 41 12 248 A1). The latter method compromises important physico-chemical properties of the resulting composition, when compared to neat PTFE, or requires uneconomical and cumbersome removal of the host material.

There exist PTFE grades of low molecular weight and of low viscosity. These grades, which are often are referred to as micropowders, commonly are used as additives in inks, coatings and in thermoplastic and other polymers to impair, for example, nucleation, internal lubrication or other desirable properties that, in part, stem from the unique physico-chemical properties of the neat PTFE. Low molecular weight PTFE grades, in their solid form, unfortunately, exhibit extreme brittleness and, according to at least one of the suppliers, these PTFE grades . . . "are not to be used as molding or extrusion powders" (Du Pont, Zonyl® data sheets and url:http://www.dupont.com/teflon/fluoroadditives/about.html—Jul. 7, 1998).

Thus, a need continues to exist to develop melt-processible, thermoplastic poly(tetrafluoroethylene)s to exploit the outstanding properties of this polymer in a wider spectrum of product forms, as well as to enable more economical processing of this unique material.

SUMMARY OF THE INVENTION

Surprisingly, it has been found that poly(tetrafluoroethylene)s of a particular set of physical characteristics provide a solution to the above, unsatisfactory situation.

Accordingly, it is one objective of the present invention to provide melt-processible, thermoplastic PTFE compositions of good mechanical properties comprising PTFE grades that are characterized as having a non-zero melt-flow index in a particular range. As used herein, the indication "good mechanical properties" means the polymer has properties suitable for use in thermoplastic applications, and exhibits an strain at break of at least 10% or a stress at break of greater than 15 MPa, determined under standard ambient conditions at a strain rate of 100% per min.

Yet another object of the present invention is to provide melt-processible PTFE of good mechanical properties that exhibit a plateau value of the complex viscosity measured at frequencies below about 0.01 rad/s and at a temperature of 380° C. and strong shear thinning that is in a range beneficial for processing.

Still another object of the present invention is to provide melt-processible PTFE of good melt stretchability.

Another object of the present invention is to provide melt-processible PTFE that in its oriented solid form has a crystallinity of between about 1% and about 60% and good mechanical properties.

Still another object of the present invention is to provide a melt-blending method that yields melt-processible, thermoplastic PTFE compositions of good mechanical properties comprising PTFE grades that are characterized in having a non-zero melt-flow index in a particular range.

Additionally, it is an object of the present invention to provide a method to melt-process PTFE compositions that comprise PTFE grades that are characterized in having a non-zero melt-flow index in a particular range, into useful shapes and articles of good mechanical properties.

Still another object of the present invention is to provide useful shapes and articles of good mechanical properties that are manufactured by melt-processing of PTFE compositions that comprise PTFE grades that are characterized in having a non-zero melt-flow index in a particular range.

Yet another object of this invention is to provide novel useful shapes and articles that comprise PTFE.

Yet a further object of this invention is to provide a composition comprising tetrafluoroethylene polymer, or blend of two or more tetrafluoroethylene polymers wherein said polymer or said blend of two or more polymers has a melt-flow index of between 0.2-200 g/10 min and is extensional or shear flow processible.

The present invention provides a melt-processible fluoropolymer having a peak melting temperature of at least 320° C. and good mechanical properties. And compositions and articles comprising at least in part a continuous polymeric phase comprising a melt-processible fluoropolymer having a peak melting temperature of at least 320° C. and good mechanical properties.

The present invention also provides a composition comprising a melt-processible tetrafluoroethylene polymer, or a melt-processible blend of two or more tetrafluoroethylene polymers wherein said polymer or said blend of two or more polymers has good mechanical properties. And a process for producing a melt-processible composition comprising a melt-processible tetrafluoroethylene polymer, or a melt-processible blend of two or more tetrafluoroethylene polymers wherein said polymer or said blend of two or more polymers has good mechanical properties. Also a method for producing an article comprising melt-processing a composition comprising a melt-processible tetrafluoroethylene polymer, or a melt-processible blend of two or more tetrafluoroethylene polymers wherein said polymer or said blend of two or more polymers has good mechanical properties.

Another aspect of the present inventions includes using the melt-processible polymer or polymer composition as an adhesive. The present invention provides a process for connecting parts comprising adhering a part to at least one further part with the polymer or composition of the present invention.

Additional objects, advantages and novel features of the present invention will be set forth in part in the description which follows, and in part will become apparent to those skilled in the art on examination of the following, or may be learned by practice of the invention. The objects and advantages of the invention may be realized and attained by means of the instrumentalities and combinations particularly pointed out in the appended claims.

DETAILED DESCRIPTION OF THE INVENTION

Figure 1:
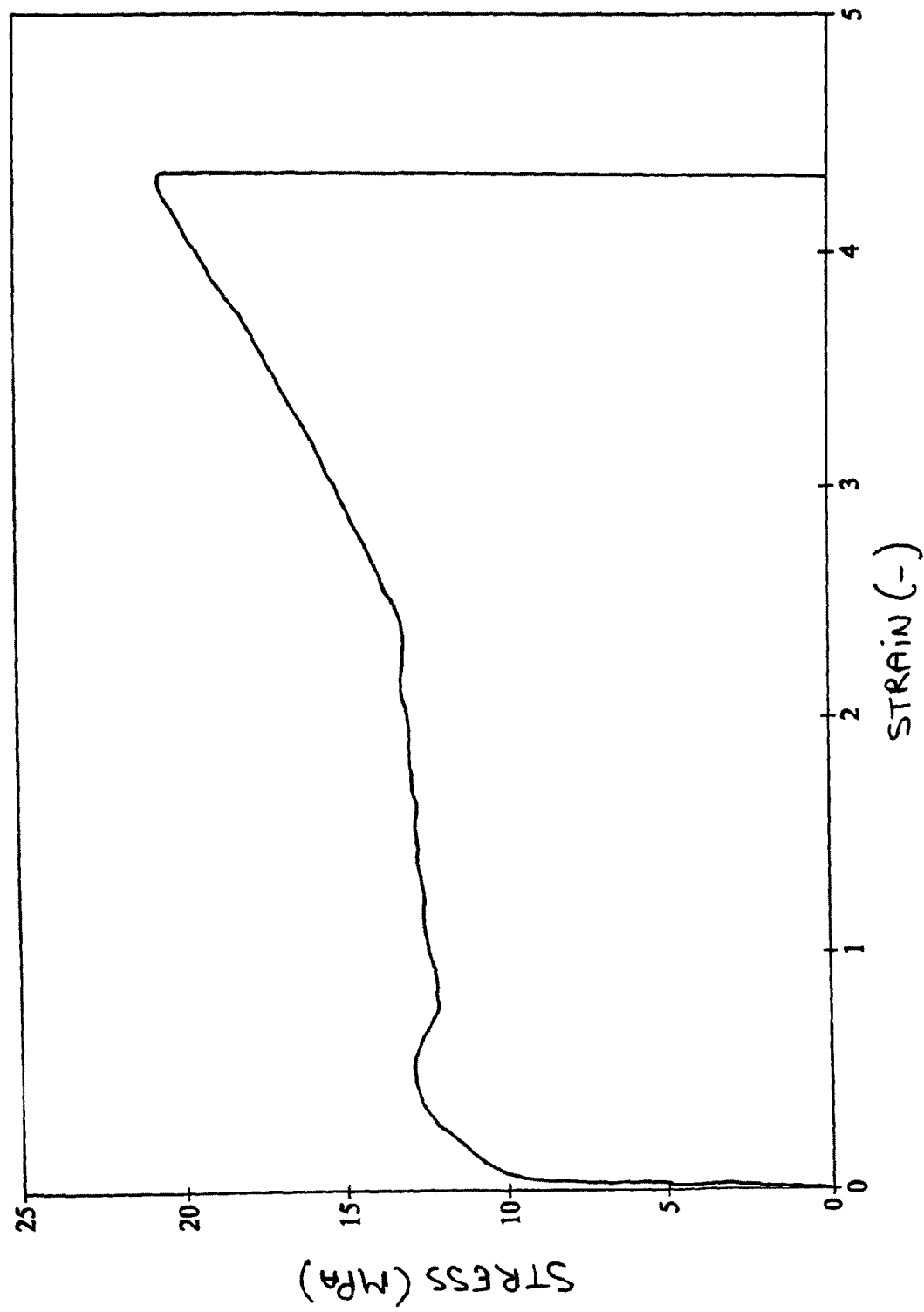
FIG. 1 is a stress-strain curve of a melt-processed film of PTFE according to the present invention.
Figure 2:
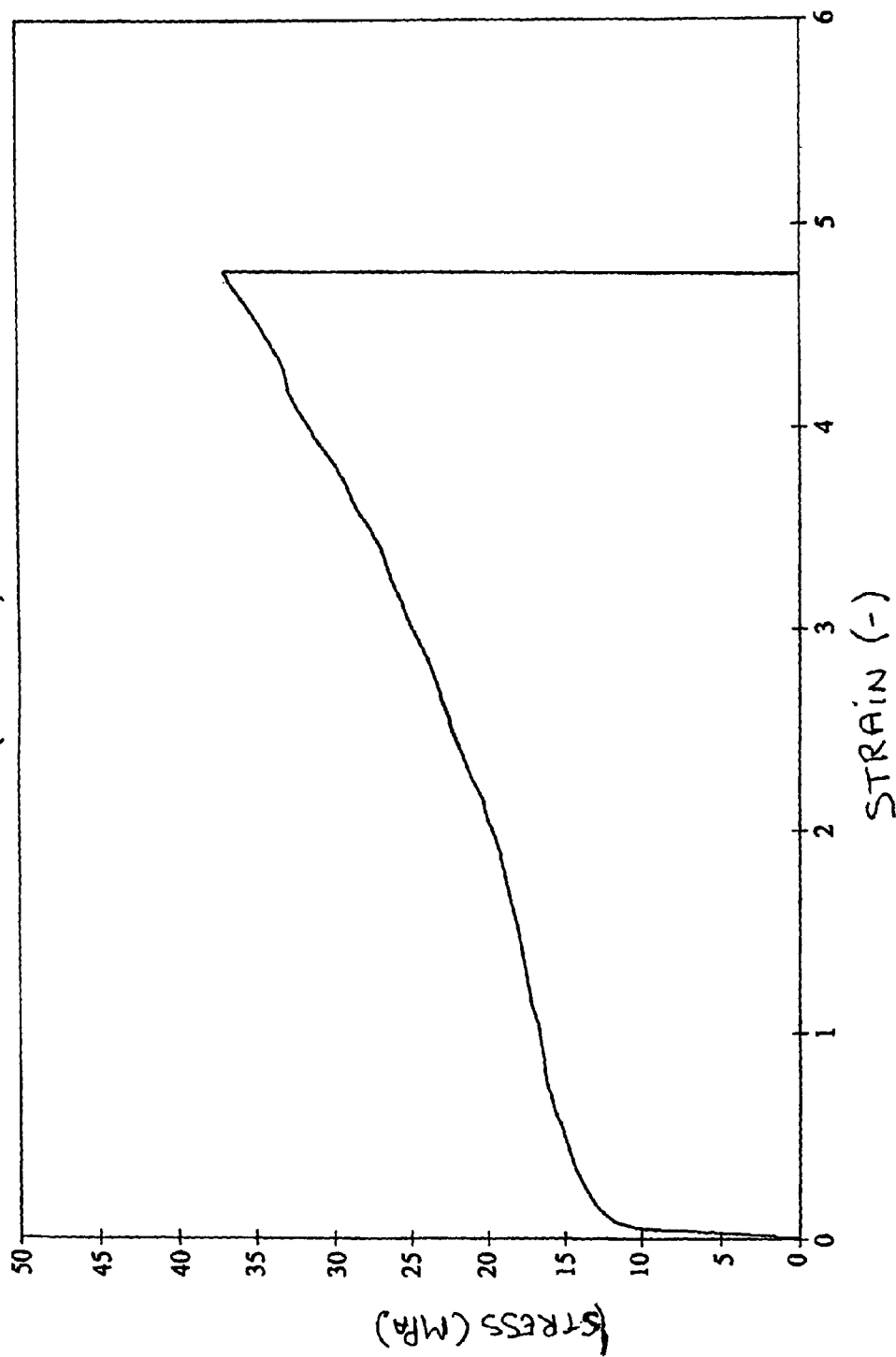
FIG. 2 is a prior art commercial, sintered and skived film of common (ultra-high molecular weight) PTFE.

The following is a list of defined terms used herein:

Void free-refers to a polymer or polymer composition, below its crystallization temperature, having a void content lover than sintered tetrafluoroethylene polymers including sintered tetrafluoroethylene polymers modified up to 0.1 wt % with PPVE (which are reported to have a void content of 2.6‰ or higher in the Modern Fluoropolymers, J. Scheirs, Ed. Wiley (New York 1997) at p. 253). Preferably, void free refers to a polymer or polymer composition, below its crystallization temperature, having a void content lower than 2‰ as determined by measuring gravimetrically the (apparent) density of a specimen and the intrinsic density via its IR spectroscopically determined amorphous content (as discussed in the Modern Fluoropolymers, J. Scheirs, Ed. Wiley (New York 1997) at pp. 240-255, in particular p. 253; the entire disclosure of which is, 1997, p. 240).

For the purpose of this invention, the ratio of the linear rate of fiber accumulation $V_2$ (m/min) to the linear rate of melt-extrusion $V_1$ (m/min) at 380° C. is called the spin stretch factor (SSF). The stretching rate $V_{st}$ (%/sec) is expressed by the following equation:

$$V_{st}=(V_2-V_1)L\times(100/60)$$

where L (m) is the distance between the orifice exit and solidification point of the molten filament. The term (100/60) is for conversion to %/sec. The quantities SSF and $V_{st}$ herein are used, among other things, to define melt-stretchability.

Monomeric units—refers to a portion of a polymer that corresponds to the monomer reactant used to form the polymer. For example, $—CF_2CF_2—$ represents a monomeric unit derived from the monomer reactant tetrafluoroethylene.

The term PTFE grades as used herein refer to the fluoropolymer exclusive of the fillers and/or other components. It is understood and well-know that added matter, such as fillers, reinforcing matter, dyes, plasticizers and the like, may influence various material characteristics. The added matter, and the possible resulting effect on materials properties, however, are not to be considered in defining the particular set of properties of the melt-processible PTFE of the present invention.

The Poly(Tetrafluoroethylene)s

The PTFE's according to the present invention generally are polymers of tetrafluoroethylene. Within the scope of the present invention it is contemplated, however, that the PTFE may also comprise minor amounts of one or more co-monomers such as hexafluoropropylene, perfluoro(methyl vinyl ether), perfluoro-(22-dimethyl-1,3-dioxole), and the like, provided, however that the latter do not significantly adversely affect the unique properties, such as thermal and chemical stability of the PTFE homopolymer. Preferably, the amount of co-monomer does not exceed about 5 weight percent, and more preferred are PTFE's that comprise less than about 1 weight percent of co-monomer. Preferably, the amount of such co-monomer does not exceed about 3 mole percent (herein "mol %"), and more preferably less than about 1 mol %; particularly preferred is a co-monomer content of less than 0.5 mol %. In the case that the overall co-monomer content is greater than 0.5 mol %, it is preferred that amount of the a perfluoro(alkyl vinylether) co-monomer is less than about 0.5 mol %. Suitable polymers include those having a peak melting temperature, as measured under standard conditions, that exceeds about 320° C., preferably above 325° C. Preferably the polymer will have no peak melting temperatures below 320° C. and more preferably the polymer will have a single peak melting point which is above 320° C. Most preferred are PTFE homopolymers.

In addition, suitable poly(tetrafluoroethylene)s according to the present invention include those having good mechanical properties, combined with a highly beneficial thermoplastic flow behavior. An indication of the thermoplastic flow behavior of the polymer can be readily analyzed with the commonly employed method of the determination of a melt-flow index (MFI). The latter method, for the present PTFE's is conveniently and reproducibly carried out according to ASTM test D1238-88, at 380° C. under a load of 21.6 kg, herein referred to as the melt flow index or alternatively MFI (380/21.6). Under these experimental conditions, and in a maximum extrudate-collection time of 1 hr, conventional ultra-high molecular weight PTFE grades have an MFI of zero.

Preferably, the PTFE grades according to the present invention have a non-zero MFI (380/21.6) in a maximum extrudate-collection time of 1 hr. More preferably, the PTFE's are characterized by an MFI (380/21.6) of greater than about 0.005, more preferably of greater than about 0.2 g/10 min and most preferably of greater than 0.25 g/10 min. The maximum value of the melt-flow index of the PTFE grades used in the present invention depends on the particular end product and processing technique. An upper value of the MFI of about 10 g/10 min is preferred for most applications in which the polymer solid is substantially isotropic; more preferred is an upper value of the MFI of about 5 g/10 min, and most preferred is 2.5 g/10 min. As further elaborated upon below, the presence or absence of molecular orientation is readily established by heating the article to a temperature that is above its melting temperature. In embodiments in which the PTFE grades are employed in articles which are produced under processing conditions involving extensional or shear flow, and display orientation of the polymer molecules as defined above, the PTFE grades are characterized by a preferred range of the melt flow index of an upper limit of 200 g/10 min; more preferred the upper limit is about 75, and most preferred 50.

If in this case the PTFE grades according to the present invention comprise a relatively high content of comonomer the upper limit of the MFI range of the preferred grades could be higher. For example, if the PTFE contains up to 3 mol % of comonomer, the upper limit of the MFI range could extend up to about 25 g/10 rain, and a preferred range would be between 0.1 up to about 15; when the comonomer content is about 1 mol % or less, the MFI range may extend up to about 15 g/10 min, more preferably the MFI range would be between 0.1 up to about 10 g/10 min; and at a content of 0.3 mol % or less the suitable MFI the preferred range would not exceed about 5 g/10 min and more preferably would have an MFI value in the above-noted range for PTFE polymers. In the event the PTFE comprises a comonomer and is oriented even higher MFI index could be useful including MFI ranges up to about 300 g/min and more preferably 250 g/min or less.

In another embodiment of the present invention, the PTFE grades are employed in articles which are typically produced under processing conditions involving extensional or shear flow, such as melt-blown films and containers, fibers spun from the melt at a spin stretch factor greater than 1, extrusion through conical dies, and the like. Generally, these processes result in articles that are not substantially isotropic, and display preferred orientation of the polymer molecules in one or more directions. For example, in fibers spun under conditions involving extensional flow, the polymer molecules typically elongate and orient into the direction of the fiber axis. In melt-blown films, the polymer molecules commonly are elongated and oriented in the plane of the film. The presence or absence of preferred orientation of polymer molecules in finished articles, such as the above referred fibers and films, can readily be established by heating the product to, for example, 10° C. above its melting temperature, at which point elongated and oriented polymer molecules return to their relaxed isotropic state. The latter process results in macroscopic change of shape of the product. As an example, a fiber, in which the polymer molecules are oriented along the fiber axis, will shrink along its long axis and increase in diameter, upon heating of that fiber to a temperature that is above its melting temperature. For the purpose of the present invention, articles are said to be oriented when, upon heating to a temperature that is 10° C. above its melting temperature, after melting the article displays a change in size of at least 5% in at least one dimension. In embodiments in which the PTFE grades are employed in articles which are produced under processing conditions involving extensional or shear flow, and display orientation of the polymer molecules as defined above, the PTFE grades are characterized by a preferred range of the melt flow index of an upper limit of 200 g/10 min; more preferred the upper limit is about 75, and most preferred 50.

The highly beneficial thermoplastic flow behavior of the poly(tetrafluoroethylene)s according to the present invention is characterized by their linear visco-elastic behavior, which is conveniently expressed as the absolute value of the complex viscosity. Preferably, the PTFE grades according to the present invention have a (Newtonean) plateau value of the complex viscosity measured at frequencies below about 0.01 rad/s and at a temperature of 380° C. of less than about $10^9$ Pa·s; preferably less than about $10^8$ Pa·s; and most preferred less than about $5.10^7$ Pa·s. The minimum plateau value of the complex viscosity of the PTFE grades according to the present invention depends on the particular end product and processing technique. A plateau value of at least about $10^6$ Pa·s is preferred for most applications in which the polymer solid is substantially isotropic and displays no significant preferred orientation of the macromolecules.

In another embodiment of the present invention, the PTFE grades are employed in articles which are typically produced under processing conditions involving extensional or shear flow, such as melt-blown films and containers, fibers spun from the melt at a spin stretch factor greater than 1, extrusion through conical dies, and the like. In this embodiment the PTFE grades are characterized by a preferred range of the plateau value of the complex viscosity of a lower limit of $10^4$ Pa·s or more; more preferred the lower limit is about $2.10^4$ Pa·s, and most preferred about $5.10^4$ Pa·s. The PTFE grades according to the present invention additionally display a strongly reduced value of the complex viscosity measured at high frequencies. The latter property generally is indicative of strong shear thinning, which is highly beneficial for many melt-processing operations, such as injection molding, melt-spinning, and the like. When measured at a frequency of $10^2$ rad/s and at a temperature of 380° C., the preferred value of the complex viscosity is lower than about $10^5$ Pa·s, more preferred below about $5.10^4$ Pa·s, and most preferred below about $10^4$ Pa·s, but always more then about $10^2$ Pas.

The PTFE grades of the present invention display an excellent melt stretchability, which is highly beneficial for, among other things, manufacturing of films, tapes, fibers, generally thin-walled structures, and the like. As understood herein, meltstretchability means the ability of a melt of the polymer to be stretched without breaking at practically useful rates. Thus, herein, a melt of the PTFE grades of good meltstretchability used in the present invention is defined as a melt, that is extruded at 380° C., that has a spin stretch factor (SSF) of more then about 1.1, and more preferred more then about 1.2, measured at a stretching rate of 10%/sec. Under the above conditions, common PTFE grades cannot be extruded, and, thus, do not have a value of the spin stretch factor, as defined herein. Furthermore, unlike melts of common PTFE grades, melts of the PTFE grades of the present invention can be stretched at surprisingly high rates without failure, for instance at rates greater than 10%/sec, preferably between 50 up to 5000%/sec, and most preferably 100% sec up to 2500%/sec or more. These meltstretchability characteristics are highly beneficial for, among other things, high speed and economical manufacturing of films, tapes, fibers, generally thin-walled structures, and the like. As set forth in the Examples, in one embodiment of the present invention PTFE melts are stretched at stretching rates of more then 10%/sec, more preferred at more then 50%/sec, and most preferred at more then 100%/sec. Values as high as 1090%/sec have been achieved.

The poly(tetrafluoroethylene)s according to the present invention in addition to having good mechanical properties, are characterized in a relatively low crystallinity, when in unoriented form, which is beneficial for the toughness of products fabricated thereof. This degree of crystallinity is conveniently determined by differential scanning calorimetry (DSC) according to standard methods known to those skilled in the art of polymer analysis. Preferably, once-molten PTFE grades according to the present invention that are recrystallized by cooling under ambient pressure at a cooling rate of 10° C/min in unoriented forms have a degree of crystallinity of between about 1% and about 60% and preferably between about 5% and about 60%, more preferably at least about 45% and not more than 55% based on a value of 102.1 J/g for 100% crystalline PTFE (Starkweather, H. W., Jr. et al., J. Polym. Sci., polym. Phys. Ed., Vol. 20, 751 (1982)). When in the form of products such as oriented fibers, tapes, films and the like, the PTFE's according to the present invention may exhibit values of the crystallinity that are substantially higher than 60%, and may be characterized by values as high as 95%, while maintaining good mechanical properties.

Preferably, the PTFE grades according to the present invention are characterized by an MFI (380/21.6) between about 0.25 to about 200 g/10 min and a degree of crystallinity of once-molten and recrystallized unoriented material of between about 5% and about 60%. More preferably, the PTFE polymer is a polymer having a single peak melting point temperature which is above 325° C. and is preferably a homogenous blend of polymers and/or homopolymer.

The PTFE grades of the present invention can be synthesized according to standard chemical methods for the polymerization of tetrafluoroethylene as described in detail in the literature (for example, W. H. Tuminello et al., Macromolecules, Vol. 21, pp. 2606-2610 (1988)) and as practiced in the art. Additionally, PTFE grades according to the present invention can be prepared by controlled degradation of common, high molecular weight PTFE or low co-monomer content copolymers thereof, for example by controlled thermal decomposition, electron beam, gamma- or other radiation, and the like (Modern Fluoropolymers, J. Scheirs, Ed. Wiley (New York), 1997 the entire disclosure of which is hereby incorporated by reference). Furthermore, and as demonstrated in the present invention, the PTFE grades according to the present invention can be manufactured by blending of, for example, high melt-flow index grades with appropriate amounts of one or more grades of a lower, for instance below 0.5 g/10 min, or zero melt-flow index to yield homogeneously blended materials with values of the melt-flow index, viscosity or crystallinity in the desired range. The latter, in effect bimodal, trimodal or blends of even higher modality, and generally, PTFE grades with a broad molecular weight distribution, are particularly beneficial for use in processing schemes that involve elongation or shear flow, such as film blowing, melt-spinning of fibers at spin stretch factors greater than 1, extrusion through conical dies, and the like. Due to the relatively simple nature of the MFI-testing method, viscosity measurement and crystallinity determination, using, for example, these analytical tools, those skilled in the art of polymer blending can readily adjust the relative portions of the different PTFE grades to obtain the melt-processible, thermoplastic PTFE compositions according to the present invention. The present invention also contemplates compositions and articles comprising a continuous phase having at least 15 wt. %, preferably at least 45 wt. %, and more preferably at least 95 wt % of the melt-processible tetrafluoroethylene polymer including polymers that are formed by blending two or more tetrafluoroethylene polymers of the present invention. An exemplary composition could include a composition or an article wherein the continuous phase composed of at least 99 wt. % of a PTFE homopolymer filled with a filler such as talc, glass and/or other inorganic or organic particles. It may be that the filler comprise a between 10 to 90 wt. %, preferably between 10 and 45 wt % and more preferably less than 30 wt. % of the total composition (including continuous phase and filler).

The compositions according to the present invention optionally may include other polymers, additives, agents, colorants, fillers (e.g., reinforcement and/or for cost-reduction), property-enhancement purposes and the like, reinforcing matter, such as glass-, aramid-, carbon fibers and the like, plasticizers, lubricants, processing aids, blowing or foaming agents, electrically conducting matter, other polymers, including poly(tetrafluoroethylene), fluorinated polymers and copolymers, polyolefin polymers and copolymers, and rubbers and thermoplastic rubber blends, and the like. Depending on the particular application, one or more of the above optional additional ingredients and their respective amounts are selected according to standard practices known to those skilled in the art of standard polymer processing, compounding and applications.

Processing

The PTFE compositions according to the present invention can be processed into useful materials, neat or compounded, single- and multi-component shapes and articles using common melt-processing methods used for thermoplastic polymers that are well known in the art. Typical examples of such methods are granulation, pelletizing, (melt-) compounding, melt-blending, injection molding, transfer-molding, melt-blowing, melt-compression molding, melt-extrusion, melt-casting, melt-spinning, blow-molding, melt-coating, melt-adhesion, welding, melt-rotation molding, dip-blow-molding, melt-impregnation, extrusion blow-molding, melt-roll coating, embossing, vacuum forming, melt-coextrusion, foaming, calendering, rolling, and the like.

Melt processing of the PTFE compositions according to the present invention, in its most general form, comprises heating the composition to above the crystalline melting temperature of the PTFE's, which, of once-molten material, typically are in the range from about 310° C. to about 335° C., e.g. about 320° C. to about 335° C., although somewhat lower, and higher temperatures may occur, to yield a polymer fluid phase. Unlike standard (ultra-high molecular weight) PTFE above its crystalline melting temperature, the PTFE grades according to the present invention form homogenous melts that can be freed from voids and memory of the initial polymer particle morphology. The latter melt is shaped through common means into the desired form, and, subsequently or simultaneously, cooled to a temperature below the crystalline melting temperature of the PTFE's, yielding an object or article of good and useful mechanical properties. In one preferred embodiment, shaped PTFE melts are rapidly quenched at a cooling rate of more than 10° C/min, more preferably more than 50° C/min, to below the crystallization temperature to yield objects, such as fibers and films, of higher toughness. In processing operations involving transfer through one or more dies of melts of the PTFE such as in fiber spinning, film- and tape extrusion, and the like, in one embodiment of the present invention it is highly beneficial to employ conical dies of low entrance angle (less than)90° as it is well established than this reduces melt-instabilities and melt fracture, and, therewith, increases the processing speed.

In another embodiment of the present invention the PTFE is crosslinked through, for example, irradiation and the like (Fuchs, B. and Scheler, U., Macromolecules 2000, vol. 33, p. 120). When crosslinked to yield branched materials, the latter may exhibit improved film-blowing characteristics, and if crosslinked to form macroscopic networks, these materials may be a rubber, or can be subsequently stretched in the melt to yield heat-shrinkable films, or may display increased resistance to creep.

Certain articles, such as, but not limited to, fibers and films made according to the present invention optionally may, subsequently, be drawn or otherwise deformed in one or more directions, embossed, and the like to further improve the physico-chemical, mechanical, barrier, optical and/or surface properties, or be otherwise post-treated (for instance, quenched, heat treated, pressure treated, and/or chemically treated). The above methods and numerous modifications thereof and other forming and shaping, and post-processing techniques are well know and commonly practiced. Those skilled in the art of processing of thermoplastic polymers are capable of selecting the appropriate melt-processing and optional post-processing technology that is most economical and appropriate for the desired end product, or product intermediate.

Products and Applications

The products contemplated according to the present invention are numerous, and cover vastly different fields of applications. This is especially true as PTFE has been approved also for food contact and for biomedical applications. Without limiting the scope and use of the present invention, some illustrative products are indicated herein. Generally speaking, the products and materials according to the present invention include most or all applications that currently are covered by standard (ultra-high molecular weight) PTFE, and many of its modified, melt-processible co-polymers. In many cases, the present products, when compared with the latter, will have superior physical-chemical properties due to their predominant homopolymer character. Thus, applications are envisioned, among other industries, in the wire and cable industry, the printed-circuit board industry, semi-conductor industry, the chemical processing industry, the semiconductor industry, the automotive industry, out-door products and coatings industry, the food industry, the biomedical industry, and more generally in industries and uses where any combination of high release, anti-stick, high-temperature stability, high chemical resistance, flame-resistance, anti-fouling, UV resistance, low friction, and low dielectric constant is required.

In particular, the PTFE may be used to form at least parts in articles such as, for example, is a wire (and/or wire coating), an optical fiber (and/or coating), a cable, a printed-circuit board, a semiconductor, an automotive part, an outdoor product, a food, a biomedical intermediate or product, a composite material, a melt-spun mono- or multi-filament fiber, an oriented or un-oriented fiber, a hollow, porous or dense component; a woven or nonwoven fabric, a filter, a membrane, a film, a multi-layer- and/or multicomponent film, a barrier film, a container, a bag, a bottle, a rod, a liner, a vessel, a pipe, a pump, a valve, an O-ring, an expansion joint, a gasket, a heat exchanger, an injection-molded article, a see-through article, a sealable packaging, a profile, heat-shrinkable film, and/or a thermoplastically welded part. Preferred articles may include fibers, films, coatings and articles comprising the same.

Typical examples of intermediate and end-user products that can be made according to the present invention include, but are not limited to granulate, thermoplastic composites, melt-spun mono- and multi-filament fibers, oriented and not, hollow, porous and dense, single- and multi-component; fabrics, nonwovens, cloths, felts, filters, gas house filtration bags; sheets, membranes, films (thin and thick, dense and porous); containers, bags, bottles, generally simple and complex parts, rods, tubes, profiles, linings and internal components for vessels, tanks, columns, pipes, fittings, pumps and valves; O-rings, seals, gaskets, heat exchangers, hoses, expansion joints, shrinkable tubes; coatings, such as protective coatings, electrostatic coatings, cable and wire coatings, optical fiber coatings, and the like. The above products and articles may be comprised in part or in total PTFE compositions according to the present invention, or optionally include dissimilar materials, such as for example in multi-layer and multi-component films, coatings, injection molded articles, containers, pipes, profiles, and the like.

Due to the fact that the PTFE grades according to the present invention can be readily processed into mechanical coherent, tough, thin, dense and/or translucent objects, novel application areas for PTFE are contemplated that heretofore were not readily or economically, if at all, accessible due to the intractability of standard (ultra-high molecular weight) grades, notably in areas where the absence of remnants of powder morphology and voids have prohibited use of the latter material. Preferably, the polymer of the present invention has sufficient clarity such that if it were formed into a 1 mm thick film, and tested at a temperature below its crystallization temperature, it would be sufficiently translucent to enable images viewed through the film to be readily recognized, preferably without distortion.

Exemplary applications of the polymer and polymer composition of the present which take advantage of some of these beneficial properties include see-through, sealable and/or heat-shrinkable packaging, barrier films and caps, conformal coatings, dense tubing and linings, thin-walled and complex injection-molded parts, and the like.

The PTFE grades according to the present invention, due to their thermoplastic nature, not only are useful for the simple and economic production of finished goods and intermediate products, but also for other functions. An illustrative example of such function, without limiting the scope of the present invention, is adhesion and welding. The latter is a well-recognized difficulty associated with common PTFE (Modern Fluoropolymers, J. Scheirs, Ed. Wiley (New York), 1997, p. 251). The PTFE grades according to the present invention were found to be outstanding adhesives, for example, for itself as well as for other fluoropolymers, preferably including common high-molecular weight PTFE products such as films, sheets and the like. Simply by inserting a small amount of a PTFE grade according to the present invention in powder, film or other form between two or more surfaces that one desires to adhere together, liquefying the former material, and subsequently solidifying under slight or modest pressure, it was found to yield a very strong adhesive bond that was provided by the inventive PTFE grades.

EXAMPLES

The following examples are given as particular embodiments of the invention and to demonstrate the practice and advantages thereof. It is understood that the examples are given by way of illustration and are not intended to limit the specification or the claims that follow in any manner.

General Methods and Materials

Melt-Flow Index. Values of the melt flow index (MFI) as discussed herein are determined in accordance with the ASTM Standard D1238-88 at a temperature of 380° C. and under a load of 21.6 kg during a maximum extrudate-collection time of 1 hr using a Zwick 4106 instrument.

Viscosity. The absolute values of the complex viscosities of different PTFE grades were measured from small amplitude oscillatory shear experiments (Rheometrics Dynamic Spectrometer RDS-II) at 380° C. for several frequencies between 100 rad/s and $3.10^{-3}$ rad/s using standard plate-plate geometry. The linear range was estimated from strain-sweep experiments at 100 rad/s.

Thermal Analysis. Thermal analysis was conducted with a Netzsch differential scanning calorimeter (DSC, model 200). Samples of about 5 mg were heated at a standard rate of 10° C./min. Unless indicated otherwise, melting temperatures given herein refer to the endotherm peak temperatures of once molten (at 380° C.) and cooled (at 10° C./min) material. Crystallinities were determined from the enthalpies of fusion of the same specimen taking the value of 102.1 J/g for 100% crystalline PTFE (Starkweather, H. W., Jr. et al., J. Polym. Sci., Polym. Phys. Ed., Vol. 20, 751 (1982)). Mechanical Data Tensile tests were carried out with an Intron Tensile Tester (model 4411) at room temperature on dumbbell-shaped specimen of 1-2 mm gauge length and 2 mm width and fibers. The gauge fiber length was 20 mm. The standard strain rate was 100%/min.

Materials. Various grades of PTFE, purchased from Du Pont (Teflon®, Zonyl®), Ausimont (Algoflon®) and Dyneon, were used. The following Table I presents an overview of the melting temperatures and the crystallinities of materials that were once molten at 380° C. and recrystallized by cooling at 10° C./min, and MFI (380/21.6) of the different grades, which include grades both outside the invention, and those according to the present invention.

TABLE I

| PTFE grade | | Melting Temperature* (° C.) | Crystallinity (%) | MFI (380/21.6) (g/10 min) |
|---|---|---|---|---|
| I | Zonyl ® MP 1200 | 325.9 | 64.8 | >>1,000 |
| II | Zonyl ® MP 1100 | 325.0 | 67.2 | >1,000 |
| III | Zonyl ® MP 1600N | 329.0 | 68.9 | 150 |
| IV | Dyneon ® 9207 | 329.8 | 65.1 | 55 |
| V | Zonyl ® MP 1000 | 329.3 | 59.5 | 52 |
| VI | blend V/XX** | 331.6 | 60.5 | 35 |
| VII | Dyneon ® 9201 | 330.5 | 60.9 | 22 |
| VIII | blend V/XX** | 331.4 | 59.9 | 15 |
| IX | Zonyl ® MP 1300 | 329.9 | 60.5 | 10 |
| X | Algoflon ® F5A EX | 330.7 | 61.7 | 9 |
| XI | Zonyl ® MP 1400 | 330.8 | 57.3 | 2.8 |
| XII | Algoflon ® L206 | 332.3 | 60.8 | 2.6 |
| XIII | blend IX/XX** | 331.2 | 51.9 | 1.8 |
| XIV | blend XI/XIX** | 329.3 | 49.9 | 1.2 |
| XV | blend V/XIX** | 329.4 | 51.4 | 1.0 |
| XVI | blend XI/XIX** | 329.7 | 47.6 | 0.8 |
| XVII | blend IX/XX** | 330.5 | 50.9 | 0.8 |
| XVIII | blend IX/XX** | 331.5 | 47.5 | 0.6 |
| XIX | Zonyl ® MP 1500J | 327.5 | 44.2 | 0.2 |
| XX | Teflon ® 6 | 328.6 | 33.7 | 0.0 |
| XXI | Dyneon TFM ® 1700 | 327.0 | 27.0 | 0.0 |

*Note:
all grades exhibited the well-know thermal transitions around room temperature, typical of PTFE, and only one main melting endotherm at the elevated temperatures above indicated.
**for compositions and preparation of blends see Examples 7 and 9.

Comparative Example A

PTFE grades I-XII (Table I) were melt-compression molded at 380° C. with a Carver press (model M, 25 T) for 5 min at 1 metric ton (t), 10 min at 10 t, and then cooled to room temperature during 4 min under 4 t into plaques of about 4×4×0.1 cm. All grades were found to yield brittle products (strain at break of less then 10%) most of which could not be removed from the mold without fracture.

Example 1

Example A was repeated with PTFE grades XIII-XVIII. The materials were melt-compression molded at 380° C. with a Carver press (model M, 25 T) for 5 min at 1 metric ton (t), 10 min at 10 t, and then cooled to room temperature during 4 min under 4 t into plaques of about 4×4×0.1 cm. These grades were found to yield mechanically coherent, and translucent samples that could readily be removed from the mold and bend without fracture. Mechanical testing of the plaques indicated that the strain at break of all samples exceeded 10%; typical values exceeded 250%.

Comparative Example B

Attempts were made to melt-compression mold at 380° C. with a Carver press (model M, 25 T) films of PTFE grades I-XII. All grades were found to yield brittle products that could not be mechanically removed from the mold without fracture.

Example 2

Example B was repeated with PTFE grades XIII-XVIII. The materials were melt-compression molded at 380° C. with a Carver press (model M, 25 T) for 5 min at 1 metric ton (t), 10 min at 10 t, and then cooled to room temperature during 4 min under 4 t into thin films of about 15×15× about 0.025 cm.

These grades were found to yield mechanically coherent, translucent and flexible films that could readily be removed from the mold.

The mechanical properties of the melt-processed PTFE films were measured according to the standard method detailed above. A typical stress-strain curve is presented in FIG. 1 (A), for comparison purposes, together with that of a sample of commercial, pre-formed/sintered and skived film of 0.40 mm thickness (B). This figure shows that the melt-processed PTFE film (here of grade XVI (Table I)) has the typical deformation properties of a thermoplastic, semi-crystalline polymer with a distinct yield point and strain hardening. The stress-strain curves A and B resemble each other, which indicates that these melt-processed PTFE films do not have substantially inferior mechanical properties when compared to common, PTFE of ultra-high molecular weight. The mechanical data of the two products are collected in Table II.

TABLE II

| PTFE film | Yield Stress (MPa) | Tensile Strength (Nominal, MPa) | Strain at Break (%) |
|---|---|---|---|
| Skived Film | 12.8 | 36.1 | 476 |
| Melt-processed Film of PTFE grade XVI | 12.6 | 20.9 | 427 |

The excellent mechanical properties of the film according to the present invention were not affected by storing the sample for periods in excess of 15 hrs at temperatures of 200° C. and higher and had a strain and stress at break that were within experimental error identical to the respective values of the non-heated films.

In addition, we observed that the melt-processed PTFE films, unlike the commercial skived material, were dense and translucent, through which text readily could be read up to a film thickness of about 1 mm.

Comparative Example C

PTFE grades I-V, VII, IX-XII and XX were introduced into a laboratory melt-spinning apparatus (SpinLine, DACA Instruments), the temperature of which was kept at 380° C., and that was equipped with a die of 1 mm diameter (length/diameter ratio 1, entrance angle 45°). PTFE grades I-V, VII, IX-XII could not be collected as monofilaments due to brittleness of the extrudate, leading to premature fracture. Ultra-high molecular weight PTFE grade XX could not be melt-spun, even at loads up to 5 kN (limit of equipment), due to the high viscosity (zero MFI) of the material.

Example 3

Example C was repeated with PTFE grade XV. PTFE monofilaments were collected without draw down (spin stretch factor substantially equal to 1) onto bobbins. The filaments were tough, and could readily be drawn at room temperature to draw ratios exceeding 4 (strain at break larger then 300%).

The mechanical properties of the melt-spun fibers were measured according to the method detailed above. Their tensile strength was 0.11 GPa.

Comparative Example D

PTFE grades I-V, VII, IX-XII and XX were introduced into a laboratory, recycling twin-screw extruder (MicroCompounder, DACA Instruments), the temperature of which was kept at 380° C., and that was equipped with an exit die (entrance angle 90°) of 2 mm diameter. PTFE grades I-V, VII, IX-XII could not be collected as continuous extrudates due to extreme brittleness of the extrudate, leading to premature fracture. Ultra-high molecular weight PTFE grade XX could not be extruded due to the high viscosity (zero MFI) of the material.

Example 4

Example D was repeated with PTFE grades XIII-XVIII. Continuous PTFE extrudates were readily collected without draw down (spin stretch factor substantially equal to 1). The extrudates could readily be chopped into granulate or drawn into monofilaments.

Example 5

Figure 3:
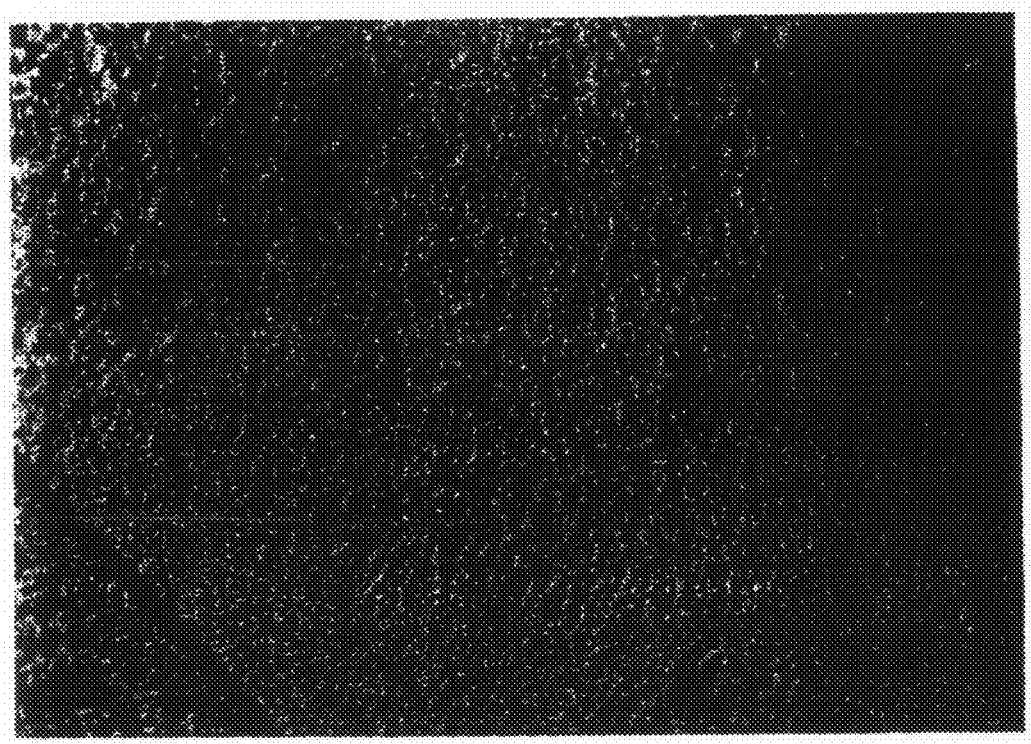
FIG. 3 is an optical micrograph (magnification 200×) of a thin section of PTFE according to the present invention into which 10% w/w of $TiO_2$ was melt compounded

PTFE grade XV was melt-compounded at 380° C. in a Brabender DSK25 segmented, co-rotating extruder (25 mm diameter; 22 aspect ratio) with 0.1 weight % of various dyes (Amaplast® Blue HB, Red RP, Yellow NX, Color Chem. Int. Corp.), 10% of $TiO_2$ (Fluka), 10 weight % of aramid pulp (Twaron®, Akzo Nobel), and 20 weight % of chopped, 15 mm long carbon fiber, respectively. Subsequently, the compounded materials obtained were melt-processed into plaques according to the method in Example 1. Optical microscopy on thin sections (about 0.1 mm) revealed that in all cases extremely homogeneous mixtures and composites were obtained (FIG. 3) without significant aggregation of the added matter. This example shows that PTFE according to the present invention can be melt-compounded.

Comparative Example E

Two strips of about 7×1×0.04 cm of commercial, skived film of high molecular weight PTFE were pressed together in a Carver press (model M, 25T) at a temperature of 380° C. under a load of less than 1 t for 2 min and subsequently cooled to room temperature. Without much force, the strips could be separated from each other, which is indicative of poor adhesion, and illustrates the difficulties encountered in welding of common PTFE.

Example 6

Comparative Example E was repeated. However, a small piece of melt-processed film of PTFE grade XV (about 1×1×0.02 cm) was placed in between the two strips of about 7×1×0.04 cm of commercial, skived film of high molecular weight PTFE. This sandwich structure was also pressed together in a Carver press (model M, 25T) at a temperature of 380° C. under a load of less than 1 t for 2 min and, subsequently, cooled to room temperature. The strips could be separated from each other only after one or both of the skived material strips exhibited excessive plastic deformation, which is indicative of outstanding adhesive properties of this grade to, for example, common PTFE.

Example 7

Various amounts (total quantity 90 g) of PTFE grades V and XXI, XI and XXI, V and XIX, XI and XIX, and IX and XX, respectively, (see Table 1) were introduced into a Brabender melt-kneader (model Plasti-corder PL 2000), which was kept at a temperature of about 380° C., 60 rpm. After about 1 min, a clear homogeneous melt was formed that behaved like a melt of ordinary thermoplastics. Mixing was continued for 10 min, after which the blended product was discharged. The MFI values of the different blends were measured. The results are given in Table III.

TABLE III

| PTFE grades | Weight Ratio (—) | MFI (380/21.6) (g/10 min) |
| --- | --- | --- |
| XI + XXI | 60-40 | 0.4 |
| IX + XX | 45-55 | 0.6 |
| IX + XX | 50-50 | 0.8 |
| V + XXI | 60-40 | 0.8 |
| XI + XIX | 10-90 | 0.8 |
| V + XIX | 12.5-87.5 | 1.0 |
| XI + XIX | 25-75 | 1.2 |
| IX + XX | 60-40 | 1.8 |

This example shows that PTFE grades according to the present invention of an MFI value in a desired range can be prepared by melt-blending of PTFE grades of substantially different MFI.

The same PTFE samples were processed into films according to the method in Example 2. All films were found to exhibit good mechanical properties (strain at break >10%).

Example 8

Various amounts (total quantity 90 g) of PTFE grades V and XIX, and IX and XX, respectively, (see Table 1) were introduced into a Brabender melt-kneader (model Plasti-corder PL 2000), which was kept at a temperature of about 380° C., 60 rpm. After about 1 min, a clear homogeneous melt was formed that behaved like a melt of ordinary thermoplastics. Mixing was continued for 10 min, after which the blended product was discharged. The absolute values of the complex viscosities of various PTFE samples were measured from small amplitude oscillatory shear experiments. The results are given in Table IV.

TABLE IV

| PTFE grades | Weight Ratio (—) | Viscosity (Pa · s) |
| --- | --- | --- |
| V + XIX | 60-40 | $9.3 \cdot 10^5$ |
| V + XIX | 40-60 | $5.5 \cdot 10^6$ |
| V + XIX | 20-80 | $8.4 \cdot 10^6$ |
| V + XIX | 10-90 | $1.3 \cdot 10^7$ |
| IX + XX | 60-40 | $1.2 \cdot 10^7$ |
| IX + XX | 50-50 | $1.8 \cdot 10^7$ |
| IX + XX | 45-55 | $2.4 \cdot 10^7$ |

The same PTFE samples were processed into films according to the method in Example 2. All films were found to exhibit good mechanical properties (strain at break >10%).

Example 9

In order to produce relatively high MFI (>2.5 g/10 min) PTFE grades of a broad molecular weight distribution, various amounts (total quantity about 5 g) of grades I, V, IX and XI with, respectively, grades XX and XXI (see Table 1) were introduced into a laboratory, recycling twin-screw extruder (MicroCompounder, DACA Instruments, Santa Barbara, Calif.), the temperature of which was kept at 380° C., and that was equipped with an exit die (entrance angle 90°) of 2 mm diameter. After 10 min of mixing at a rate of 50 rpm, the rate was reduced to 10 rpm, and the blended products were extruded at a linear rate of 15 cm/min through the orifice. The MFI values of the different blends were measured. The results are given in Table V.

TABLE V

| PTFE grades | Weight Ratio (—) | MFI (380/21.6) (g/10 min) |
|---|---|---|
| I + XXI | 90-10 | 180 |
| I + IX + XXI | 45-45-10 | 23 |
| V + XX | 98-2 | 35 |
| V + XX | 95-5 | 20 |
| V + XX | 90-10 | 15 |
| V + XXI | 98-2 | 31 |
| V + XXI | 95-5 | 19 |
| V + XXI | 92.5-7.5 | 13 |
| V + XXI | 90-10 | 9 |
| IX + XXI | 95-5 | 7 |

The above blended PTFE grades were introduced into a laboratory melt-spinning apparatus (SpinLine, DACA Instruments), the temperature of which was kept at 380° C., and that was equipped with a die of 0.5 mm or 1.5 mm diameter (length/diameter ratio 1, entrance angle 45°). The molten polymers typically were extruded at rates of about 0.1-7.0 m/min, although higher rates were possible and no upper limit was detected. The liquid filaments were cooled and solidified typically in water at a distance of 1 cm below the orifice, although cooling in air also produced satisfactory results. All blends could readily be collected in the form of continuous fibers at spin stretch factors (SSF) of about 1.2 to more than 4 and at stretching rates $V_{st}$ as high as 1000%/sec and more. With the above process, PTFE fibers were produced with diameters of a wide range from 0.5 mm to 80 μm and lower, which translated in approximately 3500 to 90 denier. It is contemplated that use of dies of lower diameter and/or higher spin stretch factors will result in the formation of PTFE fibers of diameters as low as 10 μm or less.

The mechanical properties of the various as-spun fibers were tested according to the method described above. Examples of measured fiber properties are collected in Table VI below.

TABLE VI

| PTFE grades/Weight Ratio (—) | SSF (—) | Stretch Rate (%/sec) | Diameter mm | Stress at Break (MPa) | Strain at Break (%) |
|---|---|---|---|---|---|
| V + XX/98-2 | 40.8 | 764 | 0.23 | 17 | 6 |
| V + XX/95-5 | 12.1 | 214 | 0.27 | 20 | 8 |
| V + XX/90-10 | 7.8 | 131 | 0.45 | 24 | 12 |
| IX + XXI/95-5 | 1.9 | 160 | 0.30 | 30 | 15 |
| IX + XXI/95-5 | 2.9 | 1090 | 0.20 | 26 | 6 |
| V + XXI/95-5 | 30.4 | 564 | 0.15 | 79 | 7 |
| V + XXI/95-5 | 4.8 | 660 | 0.20 | 52 | 10 |
| V + XXI/95-5 | 1.3 | 347 | 0.19 | 35 | 14 |
| V + XXI/92.5-7.5 | 1.2 | 280 | 0.30 | 54 | 16 |
| V + XXI/90-10 | 21.7 | 397 | 0.15 | 91 | 10 |
| V + XXI/90-10 | 1.3 | 347 | 0.29 | 79 | 18 |
| I + XXI/90-10 | 2.0 | 160 | 0.25 | 36 | 12 |
| I + IX + XXI/ 45-45-10 | 3.9 | 987 | 0.08 | 201 | 8 |

In order to further increase the mechanical properties of these fibers, they may be subsequently stretched according to methods well-know to those skilled in the art. By employing multi-orifice devices it is contemplated that multi-filament yarns can be produced according to the above methods. Also, it is contemplated that through the use of PTFE compounded with, for example, colorants, microscopic whiskers of reinforcing matter, and/or conductive particles, multi-functional PTFE fibers can be obtained according to the present invention.

The melting temperature of the above fibers were determined using the standard DSC method, and were found to be in the range of 328° C. to 333° C. In order to determine whether or not the fibers were oriented, a section of 30 cm was cut from each of the fibers and heated in an hot oven to a temperature that was 10° C. above their respective melting temperatures. All fibers displayed shrinkage, (original length–final length)/original length×100%, along the fiber axis of more then 5%. Typical values were in the range from about 80%-95%, with higher values generally found for fibers of a higher spin stretch factor.

These examples illustrate that also relatively high melt-flow-index (>2.5 g/min) PTFE grades of broad molecular weight distributions, such as bimodal trimodal and the like, according to the present invention under conditions of flow leading to oriented products can be processed into products of good mechanical properties.

Example 10

An amount of 1 gram of a PTFE composition of 10% w/w of PTFE grade XXI and 90% w/w of grade I prepared as in Example C, and placed between two metal surfaces that were kept at a temperature of 380° C. Once the polymer was molten, the metal surfaces were separated to a distance of 30 cm from one another at a rate of about 10 cm/sec; a thin film of PTFE was obtained. The latter, semi-transparent film had a thickness of 12 μm, and excellent mechanical properties (tensile strength of more than 15 MPa). This example demonstrates that according to the present invention PTFE can be processed into thin films, which may be of particularly beneficial use in the semi-conducting industry and in packaging. It is contemplated that such process can also be carried out with film extrusion and blowing.

Having described specific embodiments of the present invention, it will be understood that many modifications thereof will readily appear or may be suggested to those skilled in the art, and it is intended therefore that this invention is limited only by the spirit and scope of the following claims.

What is claimed is:

1. A melt-processable fluoropolymer,
the fluoropolymer being a copolymer of tetrafluoroethylene and one or more comonomers;
said one or more co-monomers being present in a total amount at less than 1 mol %;
the fluoropolymer having
a crystalline melting temperature of about 320° C.;
a stress at break of greater than 15 MPa (at room temperature and a strain rate of 100% min);
a crystallinity in the range of 5 to 60% (based on a value of 102.1 J/g for 100% crystalline PTFE); and
a melt-flow index (according to ASTM D 1238-88 at 380° C. under a 21.6 kg load) of greater than 0.25 g/10 min, and less than 75 g/10 min.

2. The fluoropolymer of claim 1, wherein said fluoropolymer has no peak melting temperature below 320° C.

3. The fluoropolymer of claim 1, wherein said comonomer consists essentially of perfluoroalkylvinyl ether.

4. The fluoropolymer of claim 3, wherein said perfluoroalkylvinyl ether is perfluoropropylvinyl ether.

5. The fluoropolymer of claim 1, wherein said one or more comonomers are present in less than 0.5 mol %.

6. The fluoropolymer of claim 1, wherein a 1 mm thick film of the fluoropolymer is translucent, at a temperature below its crystallization temperature.

* * * * *